United States Patent

[11] 3,577,167

[72] Inventor Jack Avins
Princeton, N.J.
[21] Appl. No. 709,274
[22] Filed Feb. 29, 1968
[45] Patented May 4, 1971
[73] Assignee RCA Corporation

[54] INTEGRATED CIRCUIT BIASING ARRANGEMENTS
10 Claims, 3 Drawing Figs.

[52] U.S. Cl. .......... 307/296, 307/297, 330/22, 330/25, 330/24, 307/315
[51] Int. Cl. .......... H02m 3/14
[50] Field of Search .......... 307/296, 297; 330/22, 24, 25

[56] References Cited
UNITED STATES PATENTS
3,383,612 5/1968 Harwood .......... 330/25
3,435,257 3/1969 Lawrie .......... 307/296
3,450,998 6/1969 Greefkes et al. .......... 330/24

*Primary Examiner*—Donald D. Forrer
*Assistant Examiner*—L. N. Anagnos
*Attorney*—Eugene M. Whitacre

ABSTRACT: A low output impedance bias supply for integrated circuit amplifier configurations capable of delivering an output voltage that is a constant fraction of a power supply potential. Two transistors are connected in a degenerative feedback arrangement with a pair of resistors and with a pair of semiconductor diodes, the ratio of the resistors determining the fractional output voltage developed and the diodes serving to provide a low output impedance at high frequencies.

Inventor:
JACK AVINS
BY
Attorney

INTEGRATED CIRCUIT BIASING ARRANGEMENTS

This invention relates to electrical circuits, in general, and to biasing arrangements for integrated circuits, in particular.

As used herein, the term integrated circuit refers to a unitary or monolithic semiconductor device or chip which is the equivalent of a network of interconnected active and passive circuit elements. Various problems have presented themselves in the design of such a semiconductor device. One problem, that of cascading resistance-capacitance coupled amplifiers, stems from the fact that an integrated circuit capacitor occupies a considerable area of the semiconductor chip, even for a relatively small amount of capacitance. Since the physical dimensions of the chip are limited, the size of the capacitor, and hence the amount of capacitance available for interstage coupling, must also be limited. Restricting the size of the capacitor, however, limits not only the low frequency response of the amplifier, but the high frequency response as well and, therefore, the gain at the desired signal frequency; and, because of the parasitic shunt capacitance across the integrated circuit capacitor structure, the high frequency response of the amplifier will be limited still further. Consequently, it is desirable to direct current DC couple amplifier stages wherever possible.

The cascading of DC coupled amplifier stages, however, offers problems of its own. For example, since the DC voltage appearing at the output electrode of one stage comprises the input voltage for the next succeeding stage, stable biasing networks are needed to establish the desired operating point for each of the cascaded stages. In addition, the output impedance of the bias networks must be sufficiently low at the signal frequency so that negligible signal frequency components are developed across the bias supply. This low output impedance makes it possible to eliminate external decoupling capacitors which would otherwise be required.

It is the object of the present invention to provide an improved biasing circuit which is suitable for establishing and maintaining a stable operating point for integrated circuit amplifiers in the presence of supply voltage and temperature variations.

It is another object of the invention to provide such a biasing circuit which has, in addition, a low output impedance for signal frequency components.

A biasing circuit embodying the invention includes a first transistor connected in a degenerated common emitter-type configuration and a second transistor connected in a common collector-type configuration, with the output electrode of each being coupled to the input electrode of the other.

In accordance with one embodiment of the invention, the output electrode of the first transistor is directly coupled to the input electrode of the second transistor, and the output electrode of the second is directly coupled to the input electrode of the first. A resistor connected to the collector electrode of the first transistor is selected to be of substantially the same resistance value as an unbypassed emitter resistor for the first transistor. With the resistors proportioned in this manner, an output voltage is developed across an emitter resistor for the second transistor equal to one-half the value of an operating potential supply for the circuit. A pair of semiconductor diodes are further included to respectively couple the operating potential supply to the collector electrode resistor of the first transistor and the emitter electrode resistor of that device to a source of reference potential, such as ground. The resultant arrangement provides a very low impedance voltage source at the signal frequency which may be used to establish and maintain the operating point of a semiconductor amplifier, as will be described below. A biasing circuit of the type herein described, when incorporated as an integral portion of an integrated circuit including the amplifier to be stabilized, is effective not only in maintaining the operating point of the amplifier substantially constant in the presence of supply voltage variations and temperature changes, but also in eliminating the need for external signal frequency bypassing of the bias source in high-gain multistage amplifiers.

For a better understanding of the present invention, together with further objects thereof, reference is had to the following description, taken in connection with the accompanying drawings, and its scope will be pointed out in the appended claims. In the drawings:

Figure 1:
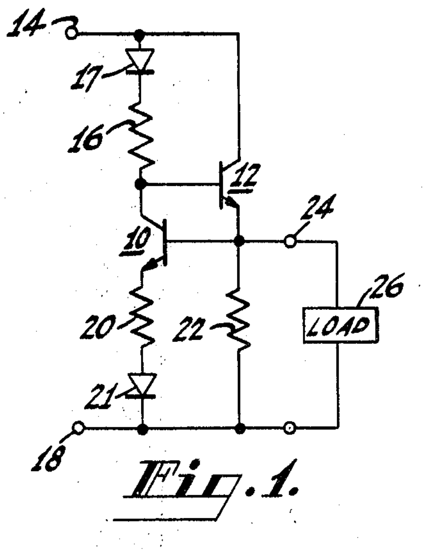
FIG. 1 is a schematic circuit diagram of a biasing circuit embodying the invention.

Referring now to FIG. 1, the biasing circuit there shown includes a pair of transistors 10 and 12. One transistor 10 is arranged in a degenerated common emitter-type configuration, with its collector electrode connected to an energizing potential terminal 14 through a series path including a first resistor 16 and a first semiconductor diode 17, and with its emitter electrode connected to a reference terminal 18 through a series path including a second resistor 20 and a second semiconductor diode 21. As shown, the anode of the diode 17 is connected directly to the terminal 14 while the cathode of the diode 21 is connected directly to the terminal 18. The other transistor 12 is arranged in a common collector-type configuration, with its emitter electrode connected to the energizing potential terminal 18 through a third resistor 22. The emitter electrode of transistor 12 is also connected to the base electrode of transistor 10 and to an output terminal 24, while the collector electrode of transistor 10 is additionally connected to the base electrode of transistor 12. A load circuit 26 is connected between the output terminal 24 and the reference terminal 18. Potential terminal 14 and reference terminal 18 are adapted to be connected to a source of energizing potential of proper polarity (not shown). In the present example, resistor 16 is selected to be of substantially the same resistance value as resistor 20.

If the current drawn by the load 26 is sufficient to permit the proper $V_{be}$ voltage drop to develop across the base-emitter junction of transistor 12, then resistor 22 may be omitted from the biasing circuit of FIG. 1. As used herein, the term $V_{be}$ voltage represents the average base-to-emitter voltage of a transistor which is operating as the active device in an amplifier circuit or the like. For silicon transistors, this $V_{be}$ voltage is approximately 0.7 volt, which is within the range of the proper $V_{be}$ voltage for Class A amplification. In the discussion that follows, it will be understood that the transistors 10 and 12 are each composed of the same semiconductor material, such as would be the case in monolithic silicon integrated circuits, so that their respective $V_{be}$ voltages are equal. It will also be understood that the semiconductor diode 17 is composed of the same material as the diode 21, so that their respective forward voltage drops are also identical. As is well known, these forward voltage drops are substantially equal in magnitude of the $V_{be}$ voltage of a transistor fabricated from the same semiconductor, and, therefore, may also be represented by the term $V_{be}$ voltage.

In operation, i.e., with a proper polarity potential source connected between the terminals 14 and 18, the biasing circuit of FIG. 1 develops an output voltage between the terminals 24 and 18 which is equal to one-half the value of the applied energizing potential. That this is so can be seen from the following derivation.

At equilibrium, the output voltage ($V_{out}$) developed between the terminals 24 and 18 is equal to the applied energizing potential ($U_{in}$) minus the forward voltage drop across the diode 17 ($V_{R_{16}}$), the voltage drop across the resistor 16 ($V_{be_{17}}$), and the $V_{be}$ of the transistor 12 or:

$$V_{out}=V_{in}-V_{be_{17}}-V_{R_{16}}-V_{be_{12}} \quad (1)$$

The voltage drop across the resistor 20 ($V_{R_{20}}$) at equilibrium is equal to the output voltage ($V_{out}$) developed between the terminals 24 and 18 minus the $V_{be}$ of the transistor 10 and the forward voltage drop across the diode 21 ($V_{be_{21}}$) or:

$$V_{R_{20}}=V_{out}-V_{be_{10}}-V_{be_{21}} \quad (2)$$

Since the resistors 16 and 20 are equal and since the same current flows through each, the voltage drop across the resistor 20($V_{R_{20}}$) equals that across the resistor 16 ($V_{R_{16}}$) and the expression (2) can be substituted for $V_{R_{16}}$ in equation (1), thusly:

$$V_{out}=V_{in}-V_{be_{17}}-V_{out}+V_{be_{10}}+V_{be_{21}}-V_{be_{12}} \quad (3)$$

With the $V_{be}$ voltages of transistors 10 and 12 equal when those transistors are composed of the same semiconductor material, and with the $V_{be}$ voltages of diode 17 and 21 also equal when they are similarly fabricated, the expression (3) reduces to:

$$V_{out}=\frac{V_{in}}{2} \quad (4)$$

illustrating that the voltage delivered by the biasing circuit to the load 26 equals one-half that of the applied energizing potential and, more particularly, one-half that applied to the anode of the diode 17. The expression (3) also illustrates that the voltage developed by the biasing circuit is independent of temperature variations.

Figure 2:
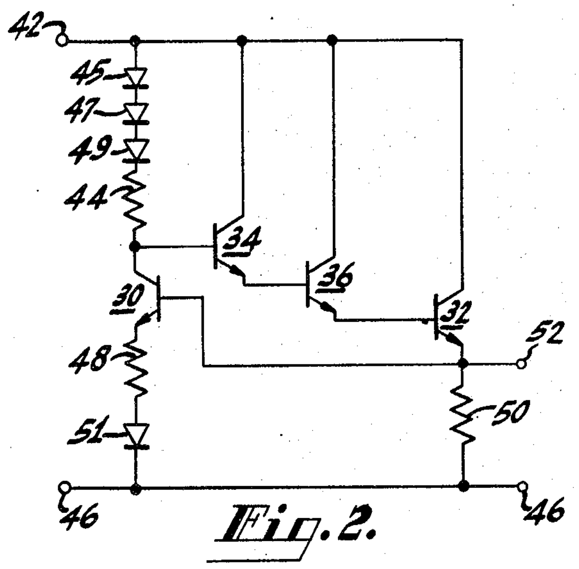
FIG. 2 is a schematic circuit diagram showing a modification of the biasing circuit of FIG. 1.

FIG. 2 shows a modified biasing circuit embodying the present invention. Like the biasing circuit of FIG. 1, the circuit of FIG. 2 also includes a first transistor arranged in a degenerated common emitter-type configuration and a second transistor arranged in a common collector-type configuration. Unlike that circuit, however, the biasing circuit of FIG. 2 uses transistor coupling to connect the output electrode of the first transistor to the input electrode of the second transistor, rather than the direct coupling used in FIG. 1.

Referring to FIG. 2, the biasing circuit there shown includes, for example, four transistors 30, 32, 34 and 36. One transistor 30 is arranged in the degenerated common emitter configuration, with its collector electrode connected to an energizing potential terminal 42 through a first resistor 44 and three serially connected semiconductor diodes, 45, 47, 49, and with its emitter electrode connected to a reference terminal 46 through a second resistor 48 and a fourth semiconductor diode 51. Another transistor 32 is arranged in a common collector configuration, with its collector electrode directly connected to the energizing potential terminal 42 and with its emitter electrode connected to the reference terminal 46 through a third resistor 50. The emitter electrode of transistor 32 is also connected to the base electrode of transistor 30 and to an output terminal 52, to which an appropriate load (not shown) may be connected.

The collector electrode of transistor 30 is additionally connected to the base electrode of transistor 32 through the transistors 34 and 36, which together with the transistor 32 effectively comprise a "Darlington" type common collector configuration. More particularly: the collector electrode of transistor 30 is connected to the base electrode of transistor 34, the emitter electrode of transistor 34 to the base electrode of transistor 36, the emitter electrode of transistor 36 to the base electrode of transistor 32, and the collector electrodes of transistors 34 and 36 to the energizing potential terminal 42. With this mode of transistor coupling, the resistor 44 connected to the collector electrode of transistor 30 is selected to be three times the resistance value of the resistor 48 connected to the emitter electrode of that transistor.

In operation, i.e., with a proper polarity potential source connected between the terminals 42 and 46, a point of equilibrium is reached at which the output voltage ($V_{out}$) developed between the terminals 52 and 46 is equal to the applied energizing potential ($V_{in}$) minus the forward voltage drops across the semiconductor diodes 45, 47, 49 ($V_{be45}$, $V_{be47}$, $V_{be49}$), the voltage drop across the resistor 44 ($V_{R44}$) and the $V_{be}$ voltages of the transistors 32, 34 and 36 or:

$$V_{out}=V_{in}-V_{be_{45}}-V_{be_{47}}-V_{be_{49}}-V_{R_{44}}-V_{be_{32}}-V_{be_{34}}-V_{be_{36}} \quad (5)$$

The voltage drop across the resistor 48 ($V_{R48}$) at equilibrium is equal to the output voltage ($V_{out}$) developed between the terminals 52 and 46 minus the forward voltage drop across the semiconductor diode 51 ($V_{be49}$) and the $V_{be}$ of the transistor 30 or:

$$V_{R_{48}}=V_{out}-V_{be_{51}}-V_{be_{30}} \quad (6)$$

Since resistor 44 is three times the value of resistor 48 and since the same current flows through each, the voltage drop across the resistor 44 is three times that across the resistor 48 and the expression (6) can be multiplied by three and substituted for $V_{R_{44}}$ in equation (5) thusly:

$$V_{out}=V_{in}-V_{be_{45}}-V_{be_{47}}-V_{be_{49}}-3V_{out}+3V_{be_{51}}+3V_{be_{30}}-V_{be_{32}}-V_{be_{34}}-V_{be_{63}} \quad (7)$$

Assuming that he transistors 30, 32, 34 and 36 are each composed of the same semiconductor material, and similarly with the diodes 45, 47, 49, 51, such as would be the case in monolithic silicon integrated circuits, then the respective transistor and diode $V_{be}$ voltages will all be equal and the expression (7) will reduce to:

$$V_{out}=\frac{V_{in}}{4} \quad (8)$$

Expression (8) thus illustrates that the voltage delivered by the biasing circuit of FIG. 2 to a load (not shown) connected to its output terminal 52 equals one-fourth that of the applied energizing potential.

Other integral fractions of the applied energizing potential can be developed as output voltages by changing the transistor coupling between the degenerated common emitter stage and the output common collector stage and by changing the ratio of the semiconductor diodes and resistors in the deenergized common emitter stage accordingly. In general, it can readily be shown that with N representing the number of stages of transistor coupling between the stages 30 and 32, output voltages equal to 1/N+2 times the applied energizing potential can be developed simply by selecting the collector resistor in the degenerated common emitter stage to be N+1 times the value of the emitter resistor of that stage, and by selecting a similar N+1 ratio between the number of collector electrode diodes and the number of emitter electrode diodes in the common emitter stage. A one-third fraction therefore requires one stage of transistor coupling and a 2:1 resistance and diode ratio, a one-fifth fraction requires three stages of transistor coupling and a 4:1 resistance and diode ratio, etc.

Throughout the foregoing derivation, the output voltage of the biasing circuit of FIG. 2 was considered as being developed between the terminals 52 and 46. If the output voltage is considered as being developed between terminals 52 and 42, instead, analysis will show that the output voltage can be expressed as N+1/N+$b_j$2 times the applied energizing potential. Thus, in the arrangement of FIG. 2, where N equals 2, the voltage developed at output terminal 52 with respect to that at terminal 42 is given by:

$$V_{out}=\frac{3V_{in}}{4} \quad (9)$$

It will be appreciated by one skilled in the art that these general 1/N+2 and N+1/ N+2 expressions for output voltage apply equally as well to the biasing circuit of FIG. 1, which represents the particular case of N equal to zero.

Figure 3:
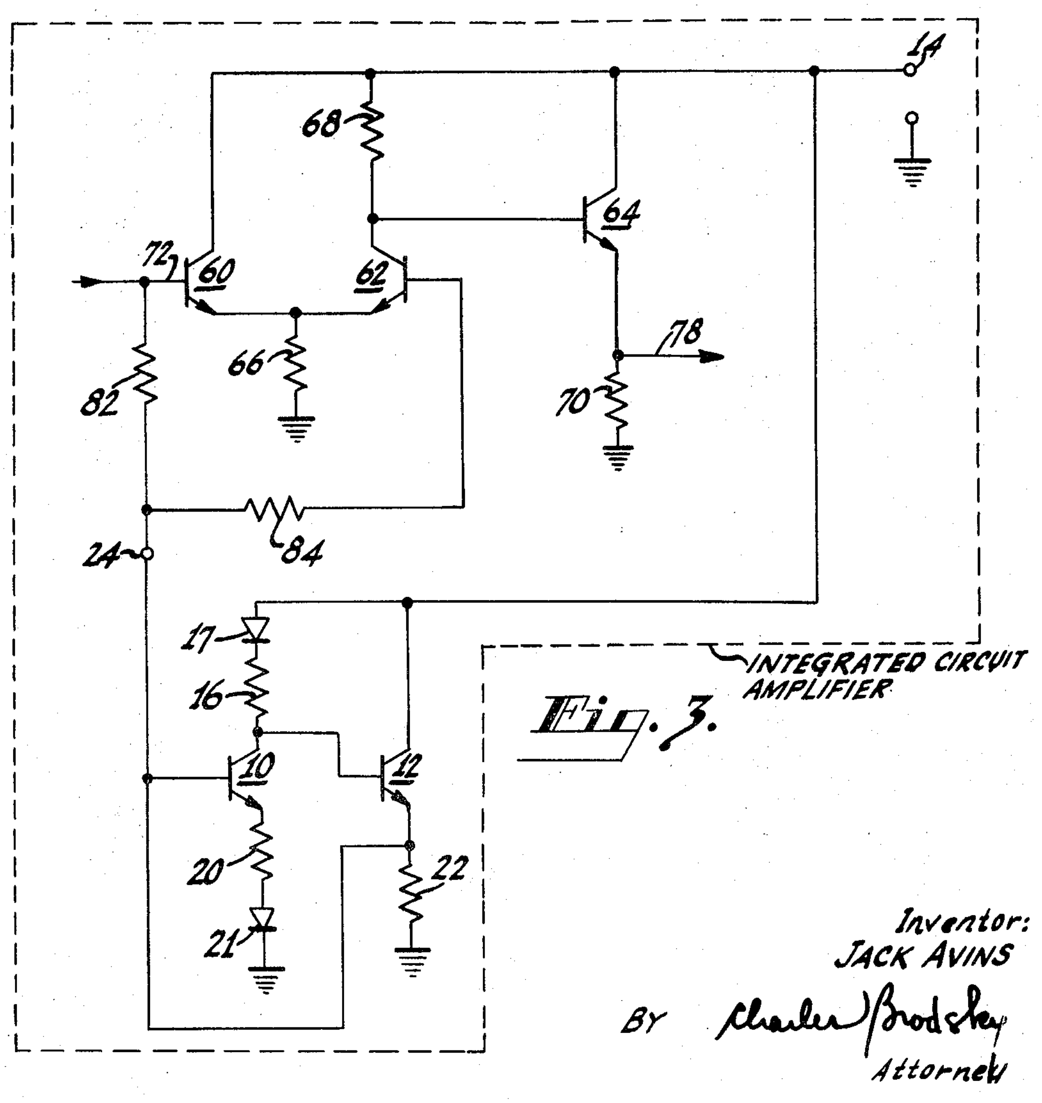
FIG. 3 is a schematic circuit diagram of an amplifier stage, with bias being provided by a biasing circuit embodying the invention.

FIG. 3 shows how the biasing circuit of FIG. 1 might be used to establish and maintain the operating point of a typical stage of a multistage direct coupled amplifier. In the discussion that follows, it will be understood that both the biasing circuit and the amplifier are formed on a single semiconductor body and comprise at least a portion of an integrated circuit chip. Those numerals used to designate the various components of the biasing circuit in FIG. 1 are used to identify similar components in FIG. 3. Reference terminal 18 has, in addition, been connected to ground.

The amplifier circuit in FIG. 3 includes three transistors 60, 62, and 64. One transistor 60 is arranged in a common collector-type configuration, with its collector electrode directly connected to the energizing potential terminal 14 and with its emitter electrode connected to ground through a resistor 66. A second transistor 62 is arranged in a common base-type configuration, with its collector electrode connected to the potential terminal 14 through a resistor 68 and with its emitter electrode connected to ground through the resistor 66. The third transistor 64 is arranged in a common collector-type configuration, with its collector electrode directly connected to the terminal 14 and with its emitter electrode connected to ground through a resistor 70. The base electrode of transistor 60 is connected via a conductor 72 to the output circuit of the preceding stage (not shown). The collector electrode of transistor 62 is connected to the base electrode of transistor 64, while the emitter electrode of that latter transistor is connected via a conductor 78 to drive an additional amplifier of the type described.

The amplifier circuit so described essentially comprises an emitter coupled amplifier stage driving a common collector stage, and is of the type disclosed in my U.S. Pat. No. 3,366,889, issued Jan. 30, 1968. That is, with a proper polarity potential source connected between terminal 14 and ground, signals supplied via conductor 72 are amplified first by the combination of transistors 60 and 62 and then by the transistor 64. Amplified signals are developed across the common collector stage resistor 70 and appear at the conductor 78, and at a DC potential substantially equal to that which is applied to the base electrode of the input transistor 60, independent of variations in environmental temperature and operating potentials. Symmetrical amplifier operation is obtained in the configuration of FIG. 3 by coupling the output voltage developed at terminal 24 of the biasing circuit to the base electrodes of transistors 60 and 62 through equal value resistors 82 and 84, respectively. In this "triad" arrangement, the amplifier stage can be iterated or cascade-connected because when the DC potential developed at the bias circuit terminal 24 is applied to the input transistor 60, that same potential will be reproduced at the output conductor 78.

An important fact to be noted in the description of the biasing circuits of FIGS. 1, 2, and 3 is that the accuracy with which the output voltage approximates 1/N+2 times the power supply voltage, on the one hand, and N+1/ N+2 times that supply voltage, on the other hand—and, as a result, the stability and balance of bias controlled circuits—is primarily dependent upon the ratio of the collector and emitter resistors for the degenerated common emitter transistor rather than upon their absolute values. This is of special significance in integrated circuit fabrication since the two resistors can be formed at the same time and their ratios can be readily maintained whereas the absolute resistance values are a function of the variables in the fabrication process. Accordingly, with a given process procedure, a higher yield of usable circuits can be expected where the ratios of the circuit components are more significant than the absolute values.

The use of the series diodes 17 and 21 in FIGS. 1 and 3, and of the diodes 45, 47, 49 and 51 in FIG. 2, furthermore, is effective in reducing the output impedance of the bias supplies shown because it provides a lower impedance load for the transistor 10 (30) and a lower driving impedance for the transistor 12 (32). This makes the output impedance less sensitive to transistor beta variations and, at the same time, minimizes phase shifts in the transistor 10 (30) which could also raise the output impedance of the bias supply. If the diodes 17 and 21 (or 45, 47, 49, and 51) were omitted, substantially greater currents would have to be drawn to achieve the same low output impedance. This would, however, increase the power requirements for, and the power dissipation on, the integrated chip. Through the use of the series diodes, the desirable lower driving impedance for transistor 12 (32) is achieved while at the same time maintaining the bias stability as a fixed fraction of the supply voltage in he face of temperature changes which affect only the absolute values of $V_{be}$ and of the integrated resistors.

As a result, the overall output impedance of the bias supply can be maintained over a wide frequency range, and the normal requirement for the use of external bypass capacitors can be eliminated.

I claim:

1. An electrical circuit for providing control voltages comprising:

first and second transistors each having an emitter electrode, a base electrode and a collector electrode;

circuit means coupled to the emitter, base and collector electrodes of said first transistor for connecting said first transistor in a degenerated common emitter configuration, said means including a first resistor and a number of semiconductor diodes serially coupled therewith to the emitter electrode of said first transistor and a second resistor substantially (N+1) times the value of said first resistor and a plurality of semiconductor diodes, (N+1) times said number of diodes, serially coupled to the collector electrode of said first transistor, where N is a positive integer equal to or greater than zero;

circuit means coupled to the emitter, base and collector electrodes of said second transistor for connecting said second transistor in a common collector configuration;

means including N additional semiconductor diode elements and the base emitter circuit of said second transistor for coupling the collector electrode of said first transistor in feedback relation to the base electrode of said first transistor;

means for coupling a source of energizing potential to said transistors;

and means coupled to said base of said first transistor for deriving an output voltage, said circuit means, including said number of diodes and said plurality of diodes, coupled to said first transistor permitting development of said output voltage at a relatively low output impedance.

2. An electrical circuit as defined in claim 1 in which said last mentioned means is arranged to provide, with respect to the end of the series coupling including said first resistor and associated diodes which is remote from the emitter electrode of said first transistor, an output voltage substantially equal to 1/N+2 times the voltage of the energizing potential source.

3. An electrical circuit as defined in claim 1 in which said last mentioned means is arranged to provide, with respect to the end of the series coupling including said second resistor and associated diodes which is remote from the collector electrode of said first transistor, an output voltage substantially equal to N+1/N+bj2 times the voltage of the energizing potential source.

4. An electrical circuit for providing control voltages comprising:

first and second transistors, each having an emitter electrode, a base electrode and a collector electrode;

first and second terminals adapted to be connected to a source of energizing potential;

a first diode;

a first resistor serially coupled with said first diode connected between the collector electrode of said first transistor and said first terminal;

a second diode;

a second resistor serially coupled with said second diode connected between the emitter electrode of said first transistor and said second terminal, with said second resistor being substantially of the same resistance value as said first resistor;

a direct current connection from the collector electrode of said second transistor to said first terminal;

a direct current connection from the collector electrode of said first transistor to the base electrode of said second transistor;

a direct current connection from the emitter electrode of said second transistor to the base electrode of said first transistor;

and means for deriving an output voltage between the emitter electrode of said second transistor and one of said first and second terminals.

5. An electrical circuit for providing control voltages comprising:

first and second transistors, each having an emitter electrode, a base electrode and a collector electrode;

first and second terminals adapted to be connected to a source of energizing potential;

a plurality of N semiconductor diode elements connected in series with the base-emitter junction of said second transistor to the collector electrode of said first transistor, with N representing a positive integer of zero or more;

a plurality of series connected diodes N+1;

a first resistor serially coupled with said N+1 diodes connected between the collector electrode of said first transistor and said first terminal;

a second diode;

a second resistor serially coupled with said second diode connected between the emitter electrode of said first transistor and said second terminal and being substantially 1/N+1 times the resistance value of said first resistor;

a direct current connection from the collector electrode of said second transistor to said first terminal;

a third resistor connected between the emitter electrode of said second transistor and said second terminal;

a direct current connection from the emitter electrode of said second transistor to the base electrode of said first transistor;

and means for deriving an output voltage between the emitter electrode of said second transistor and said second terminal 1/N+2 times the voltage of said energizing potential source, said N+1 diodes and said second diode permitting development of said output voltage at a relatively low output impedance.

6. An electrical circuit as defined in claim 2 wherein:

each of said N semiconductor diode elements comprises a base-emitter junction of a transistor, each of said last-named transistors further comprising a collector electrode direct current connected to said first terminal.

7. A biasing circuit for establishing and maintaining operating characteristics of a semiconductor amplifier comprising:

first and second transistors, each having an emitter electrode, a base electrode and a collector electrode;

first and second terminals adapted to be connected to a source of energizing potential:

a first diode;

a first resistor serially coupled with said first diode connected between the collector electrode of said first transistor and said first terminal;

a second diode;

a second resistor serially coupled with said second diode connected between the emitter electrode of said first transistor and said second terminal, and being of substantially the same resistance value as said first resistor;

a direct current connection from the collector electrode of said second transistor to and said second terminal;

a third resistor connected between the emitter electrode of said second transistor and said second terminal;

a direct current connection from the collector electrode of said first transistor to the base electrode of said second transistor;

a direct current connection from the emitter electrode of said second transistor to the base electrode of said first transistor;

and means for deriving an output voltage at low impedance equal to one-half the voltage of said energizing potential source between the emitter electrode of said second transistor and said second terminal to bias said semiconductor amplifier for said operating characteristics, said first and second diodes permitting development of said output voltage at said low impedance.

8. A biasing circuit as defined in claim 6 wherein said first and second transistors, said plurality of transistors N, said plurality of diodes N+1, said first, second and third resistors, said second diode and said direct current connections are all disposed in a single integrated circuit.

9. An electrical circuit as defined in claim 1 wherein:

each of said additional semiconductor diode elements comprises a base-emitter junction of a transistor, each of said last-named transistors further comprising a collector electrode coupled to the collector electrode of said second transistor.

10. An electrical circuit as defined in claim 9 wherein:

the emitter electrode of said second transistor is directly connected to the base electrode of said first transistor and said output voltage is derived from the emitter electrode of said second transistor.

UNITED STATES PATENT OFFICE
CERTIFICATE OF CORRECTION

Patent No. 3,577,167 Dated May 4, 1971

Inventor(s) Jack Avins

It is certified that error appears in the above-identified patent and that said Letters Patent are hereby corrected as shown below:

Column 1, line 23, that portion reading "DC" should read --(DC)--. Column 2, line 54, that portion reading "of" should read --to--; line 66, that portion reading "$(U_{in})$" should read --$(V_{in})$--; line 67, that portion reading "$(V_{R_{16}})$" should read --$(V_{be_{17}})$--; line 68, that portion reading "$(V_{be_{17}})$" should read --$(V_{R_{16}})$--. Column 4, line 16, in the equation that portion reading "$V_{be_{63}}$" should read --$V_{be_{36}}$--; line 18, that portion reading "he" should read --the--; line 36, that portion reading "deenergized" should read --degenerated--; line 55, that portion reading "N+1/N+b$_J$2" should read --N+1/N+2--. Column 5, line 75, that portion reading "he" should read --the--. Column 6, line 52, that portion reading "N+1/N+bJ2" should read --N+1/N+2--. Column 8, line 15, after "to" delete "and", after "said" delete "second" and substitute --first--.

Signed and sealed this 7th day of September 1971.

(SEAL)
Attest:

EDWARD M.FLETCHER,JR. — Attesting Officer

ROBERT GOTTSCHALK — Acting Commissioner of Patents